United States Patent [19]

Shoup

[11] Patent Number: 4,939,826

[45] Date of Patent: Jul. 10, 1990

[54] ULTRASONIC TRANSDUCER ARRAYS AND METHODS FOR THE FABRICATION THEREOF

[75] Inventor: Thomas A. Shoup, Lowell, Mass.

[73] Assignee: Hewlett-Packard Company, Palo Alto, Calif.

[21] Appl. No.: 164,273

[22] Filed: Mar. 4, 1988

[51] Int. Cl.[5] .............................................. H01L 41/12

[52] U.S. Cl. ...................................... 29/25.35; 29/594; 310/322

[58] Field of Search ............... 367/130, 154, 155, 159, 367/160, 161, 162, 164, 165, 166, 171, 176, 157, 169, 153, 140; 29/25.35, 594, 595; 264/272.11, 272.16; 310/312, 322, 325, 326, 327, 334, 337, 338, 340, 345, 348, 349, 352, 353, 367

[56] References Cited

U.S. PATENT DOCUMENTS

| | | | |
|---|---|---|---|
| 2,705,392 | 4/1955 | Imler | 310/312 |
| 4,211,948 | 7/1980 | Smith et al. | 310/322 |
| 4,310,957 | 1/1982 | Sachs | 310/368 |
| 4,572,981 | 2/1986 | Zola | 310/357 |
| 4,683,396 | 7/1987 | Takeuchi et al. | 310/358 |
| 4,756,808 | 7/1988 | Utsumi et al. | 310/322 |

*Primary Examiner*—Brian S. Steinberger
*Attorney, Agent, or Firm*—Frank R. Perillo

[57] ABSTRACT

This invention provides a method for fabricating ultrasonic transducer arrays and various transducer arrays produced utilizing such methods. The method includes the steps of cutting a block of piezoelectric material to form a plurality of wafers, each wafer being of a predetermined thickness; forming the wafers into a spaced parallel array with a center-to-center spacing between the wafers substantially equal to one-half of the object wavelength (as this term is defined in the specification); and causing the space between the wafers to be filled with a substance having an acoustic impedance which differs from that of the piezoelectric material by an amount such that the reflection coefficient between the piezoelectric material and the substance is greater than 0.9. The predetermined thickness of the wafers may be equal to one-half the piezoelectric wavelength and the substance between the wafers may be formed at least mostly of air. A material of a depth substantially equal to the spacing between wafers required to achieve the desired periodicity may be affixed to one of the adjacent wafer surfaces of each space, and this material may either be etchable and etched away to form a precise air gap between the wafers, or the material may be formed in a pattern with substantially more area without material than with material. Alternatively, a material having the required acoustic impedance mismatch, and preferably also having a relatively high absorption coefficient, is placed between each two adjacent wafers when the wafers are formed into the array.

10 Claims, 2 Drawing Sheets

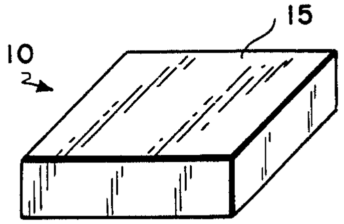
FIG.1
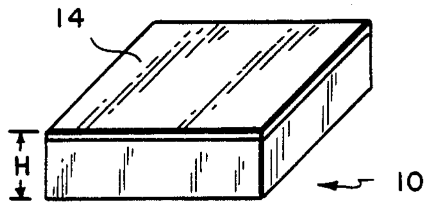
FIG.2
FIG.3
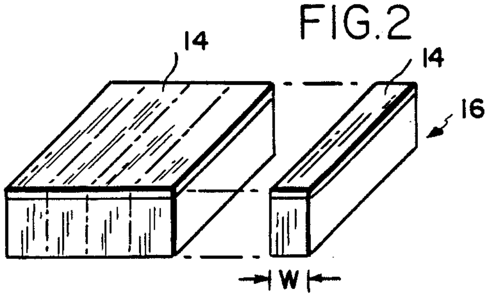
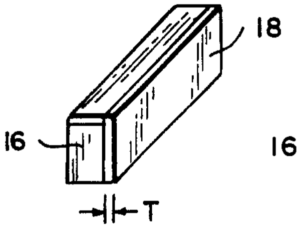
FIG.4A
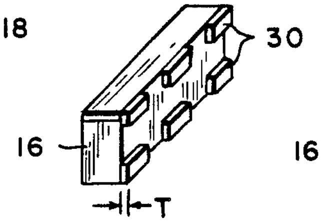
FIG.4B
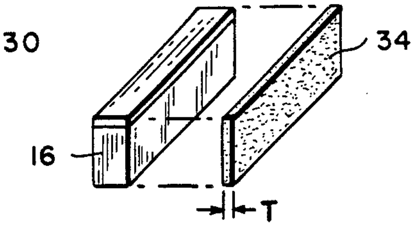
FIG.4C
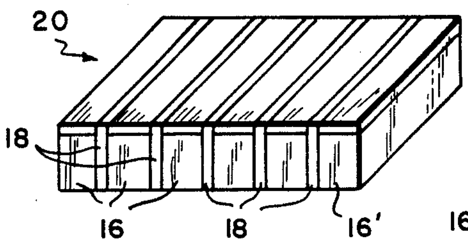
FIG.5A
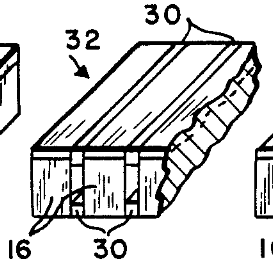
FIG.5B
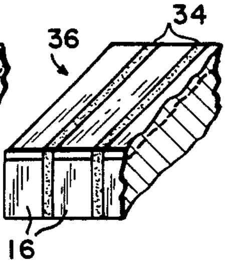
FIG.5C
FIG.6
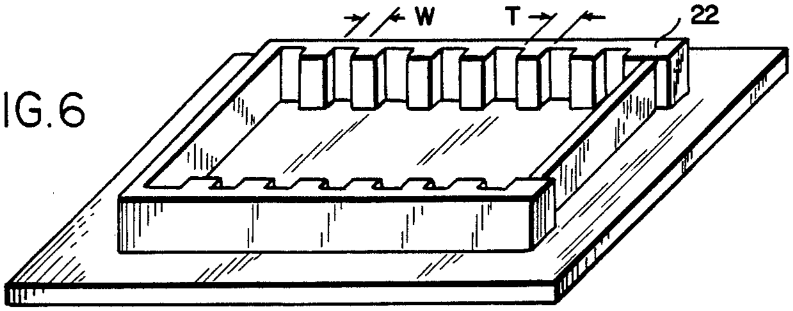

ULTRASONIC TRANSDUCER ARRAYS AND METHODS FOR THE FABRICATION THEREOF

FIELD OF THE INVENTION

This invention relates to ultrasonic transducer arrays and more particularly to improved transducer arrays and methods for the manufacture thereof which provide low acoustic coupling between piezoelectric transducer elements while permitting the required close spacing of such elements to avoid grating lobes at higher frequencies.

BACKGROUND OF THE INVENTION

Piezoelectric transducer arrays of the type used for example for medical imaging, are normally formed with a plurality of substantially parallel piezoelectric elements, adjacent elements being spaced from each other by a predetermined distance. The space between the piezoelectric elements is typically filled with a substance chosen so as to minimize crosstalk and coupling between elements (i.e. spurious stimulation of one of the piezoelectric elements by an adjacent element), thereby minimizing the loss of both range and resolution caused by such effects.

Coupling and crosstalk between elements are a function of both the reflection coefficient between the piezoelectric element and the substance in the space between elements and the lossiness or absorption coefficient of the substance. To minimize these effects, the reflection coefficient should be as near to 1 as possible, and preferably at least 0.9. The absorption coefficient should also be relatively high. Since the reflection coefficient between two substances is equal to:

$$\frac{d_2 - d_1}{d_1 + d_2} \quad (1)$$

where $d_1$ and $d_2$ are the acoustic impedance of the propagating and receiving substances respectively, it is apparent that in order to minimize the reflection coefficient, the difference between the acoustic impedance of the substance in the space between the elements and the acoustic impedance of the piezoelectric elements should be maximized. Since the piezoelectric materials typically have a relatively high acoustic impedance, generally 25 to 30 megaRayls, although crystals with much lower acoustic impedance are available, while most gases such as air have a very low acoustic impedance, for example 1.03 meqaRayls for air, and air also has a high absorption coefficient, the space between the piezoelectric elements is typically left empty so as to be filled with air.

For purposes of the following discussion, two wavelengths will be defined. As is well known, the wavelength of a particular signal in a particular medium is equal to $$\lambda = \upsilon / f \quad (2)$$

where $\lambda$ = the wavelength of the signal in the medium.

$\upsilon$ = the velocity of sound in the medium.

$f$ = the frequency of the signal.

The first wavelength to be defined will be referred to as the "piezoelectric wavelength" ($\lambda_p$). This wavelength is the wavelength of an acoustic signal in the piezoelectric element at the output frequency of the element or $$\text{Ti } \lambda_p = \upsilon_p / f_p \quad (3)$$

where $\lambda_p$ = the piezoelectric wavelength.

$\upsilon_p$ = the velocity of sound in the piezoelectric crystal medium.

$f_\mu$ = the resonant or output frequency of the piezoelectric crystal.

The "object wavelength" ($\lambda_o$) will be defined as the wavelength of a signal of frequency $f_\mu$ traveling at the velocity of sound in the object to be scanned by the transducer. Thus, $$\lambda_o = \upsilon_o / f_p \quad (4)$$

where $\upsilon_o$ = the velocity of sound in the object to be scanned.

It has been found that in order for the piezoelectric crystal to resonate in the normal operating environment for an ultrasonic transducer, the thickness of the piezoelectric crystal element should, for most piezoelectric substances, be substantially equal to one-half the piezoelectric wavelength (i.e. $\lambda_p/2$). Further, in order to avoid grating lobes in the image obtained from the transducer, it is important that the periodicity or center-to center spacing between the piezoelectric elements be substantially equal to one half the object wavelength (i.e. $\lambda_o/2$).

However, from equations 3 and 4 above, it is apparent that as the frequency of the piezoelectric element outputs increase, both the piezoelectric wavelength and the object wavelength decrease. Thus, at high frequencies, for example 10 MHz, the thickness of the piezoelectric element may be in the range of 100 to 200 microns (0.004" to 0.008") while the spacing between crystals required to achieve the desired periodicity may be in the range of 50 to 75 microns (0.002" to 0.003").

Heretofore, such piezoelectric transducer arrays have been formed by sawing or otherwise cutting a block of piezoelectric crystal which has a suitable backing bonded to it to form the desired spacing between piezoelectric elements. However, for high frequency applications where the spacing between piezoelectric elements is in the micron range, it is difficult, and sometimes impossible, to get saw blades which are thin enough, resulting in the thickness of the piezoelectric elements being less than optimum, and the spacing between elements being greater than is desired to avoid grating lobes.

Another potential problem with existing piezoelectric transducer arrays is that, since the space between the individual piezoelectric elements is filled only with air, structural support for the array is provided primarily by a backing layer. It is difficult to maintain accurate and uniform spacing between the elements in processing and use of the array without additional structural support. While various techniques such as cover layers have been provided for this purpose, such techniques have not always proved fully satisfactory, particularly in the processing of high frequency arrays having very small spaces.

A need therefore exists for improved methods of fabricating high frequency ultrasonic transducer arrays which permit the active piezoelectric transducer elements to be of desired width or thickness which permit optimum periodicity or spacing of active transducer elements, which permit the acoustic isolation between active piezoelectric elements to be maximized by having the space between the elements filled by a substance such as air providing the required impedance mismatch to achieve a high reflection coefficient, and which methods are relatively simple and inexpensive to perform. Preferably, the method will also provide enhanced structural support for the array at least during fabrication. A need also exists for various improved transducer arrays formed utilizing the above methods.

SUMMARY OF THE INVENTION

In accordance with the above, this invention provides a method for fabricating an ultrasonic transducer array adapted for scanning a selected object, the method comprising the steps of (a) cutting a block of piezoelectric material in a direction perpendicular to the top surface to form a plurality of wafers, each of the wafers being of a predetermined thickness, (b) forming the wafers into a spaced parallel array with a center-to-center spacing between the wafers substantially equal to one-half of the object wavelength; and (c) causing the space between the wafers to be filled with a substance having an acoustic impedance which differs from that of the piezoelectric material by an amount such that the reflection coefficient between the piezoelectric material and the substance is greater than 0.9. The predetermined thickness of the wafer may be equal to one-half the piezoelectric wavelength, and the substance between the wafers may be formed at least mostly of air. For some embodiments of the invention, the forming step includes affixing a material of a depth substantially equal to the spacing between wafers required to achieve the desired periodicity to one of the adjacent wafer surfaces of each space. For one embodiment of the invention, the affixed material is etchable and the forming step includes securing the wafers as an adjacent array, each adjacent pair of wafers in the array being spaced by a layer of affixed material; and etching away the affixed material, leaving the wafers mounted with the desired spacing. For this method, a means, such as a backing layer, may be mounted to the wafers to maintain their spacing after the affixed material has been etched away.

For a second embodiment of the invention, the affixing step involves affixing material in a predetermined pattern, which pattern has sufficient material to provide uniform spacing between wafers, but which pattern has substantially more area without material than with material. The wafers are then secured together with an affixed material pattern between each two adjacent wafers, the spaces in the pattern causing a sufficient portion of the space between wafers to be filled with air to cause the average acoustic impedance of the substance between the wafers to be the acoustic impedance required to achieve the desired reflection coefficient.

For a third embodiment of the invention, material of a thickness substantially equal to the desired spacing is placed between each two adjacent wafers in the array, the material being of a substance having the required acoustic impedance mismatch and preferably also having a relatively high absorption coefficient. The material is preferably composed primarily of air. The material may be in the form of a strip of, for example, a foam Teflon, the wafers and strips being secured together to form a block array which is then cut to form the individual transducer arrays. In the alternative, the material may be a closed cell foam which is injected between the wafers.

For all embodiments of the invention, at some time after the array has been formed, the spaced array is cut apart in the elevation direction to form a plurality of individual transducer arrays and leads are connected to the transducer arrays.

The foregoing and other objects, features and advantages of the invention will be apparent from the following more particular description of preferred embodiments of the invention, as illustrated in the accompanying drawings.

IN THE DRAWINGS

FIG. 1 is a top perspective view of a block of piezoelectric crystal material.

FIG. 2 is a top perspective view of the block of FIG. 1 after the step of bonding a matching layer thereto has been completed.

FIG. 3 is a top perspective view illustrating the cutting apart of the block shown in FIG. 2 into piezoelectric wafers.

FIG. 4A is a top perspective view of a single piezoelectric wafer to which a material has been affixed in accordance with a first embodiment of the invention.

FIG. 4B is a top perspective view of a single piezoelectric wafer to which a material has been affixed in a pattern in accordance with a second embodiment of the invention.

FIG. 4C is a top perspective view of a single piezoelectric wafer with an adjacent strip of an air-filled material or other substance providing a large acoustic mismatch with the piezoelectric material for use in a third embodiment of the invention.

FIG. 5A is a top perspective view of an assembled block array in accordance with one embodiment of the invention.

FIG. 5B is a partial top perspective view of an assembled block array in accordance with a second embodiment of the invention.

FIG. 5C is a partial top perspective view of an assembled block array in accordance with a third embodiment of the invention.

FIG. 6 is a top perspective view of a fixture suitable for use in assembling arrays such as those shown in FIGS. 5A-5C.

DETAILED DESCRIPTION

Figure 7A:
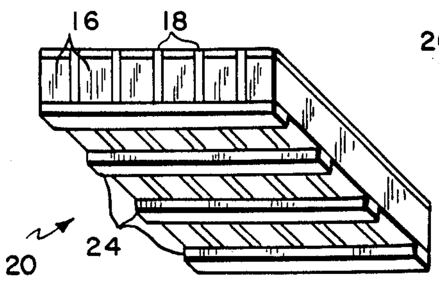
FIG. 7A is a bottom perspective view of an assembled block array of the type shown in FIG. 5A to which rails have been added.

FIG. 1 illustrates a block 10 of a conventional piezoelectric material such as a PZT-5 ceramic. The first step in practicing the teachings of this invention may be to bond a matching layer 14 to the top surface 15 of crystal block 10. The bonding of the matching layer may be accomplished by gluing a layer of a suitable material, such as a copper or other conductive filled epoxy, to the block using a crystal cement or other suitable adhesive;

by plating a layer of a material such as aluminum or magnesium on the block; or by other suitable means. Matching layer 14 is a quarter wavelength thick ($\lambda/4$) at the piezoelectric crystal frequency ($f_p$) and serves, in a well known manner, both as a protective layer for the crystal and as an impedance matching transformer. The crystal block 10 with the bonded matching layer is illustrated in FIG. 2. With some crystals, the bonding of a matching layer is not required. At this point, the block may be lapped to appropriate height H if necessary or this step may be performed at a later point in the operation.

As illustrated in FIG. 3, the crystal block 10 with matching layer 14 bonded thereto is then sawed or otherwise cut into a plurality of piezoelectric wafers 16. This operation need not be done with high precision, and some piezoelectric material will be wasted during this operation. It is desired that the width or thickness W of each of the wafers be accurately controlled so that the center-to-center spacing of the finished array is as desired. This result is typically achieved by cutting the wafers 16 to a width slightly wider than that desired and then lapping the wafers to the desired width.

As described so far, the operations are the same for all embodiments of the invention. At this point, however, the steps performed for the various embodiments of the invention start to differ. For a first embodiment of the invention, as illustrated in FIG. 4A, the next step in the operation is to plate, evaporate or otherwise affix a layer 18 of an etchable material such as aluminum to one side of each of the piezoelectric wafers 16 (except for an end wafer). The thickness T of the plated layer 18 is substantially equal to the desired spacing between wafers (i.e. t =

$$\frac{\lambda_o}{2} - W.$$

After the affixing step shown in FIG. 4A has been completed, the next step in the operation is to assemble the wafers 16 with the layers 18 thereon into a block array 20, such as the array shown in FIG. 5A, with each two crystal wafers 16 being separated by an etchable layer 18. Note that end piezoelectric wafer 16' is the only one of the wafers which does not have a layer 18. The wafers with affixed layers 18 shown in FIG. 5A may be secured together by a crystal cement or other suitable adhesive, or the wafers may be assembled and held in a fixture such as the fixture 22 shown in FIG. 6. With the fixture shown in FIG. 6, the wafers would be mounted with the matching layers 14 facing downward so that the bottom surface of the array 20 is exposed. If not done earlier, the array 20 may be lapped at this point if necessary to obtain the desired height H for the array, including the matching layer.

Figure 7B:
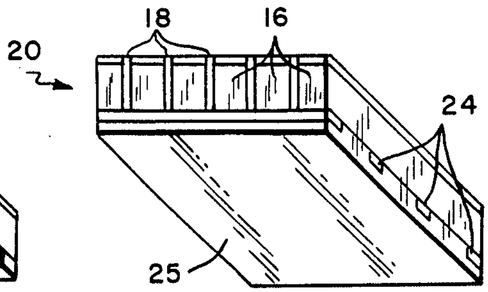
FIG. 7B is a bottom perspective view of an assembled block array with rails of the type shown in FIG. 7A to which a backing layer has been added.

As illustrated in FIG. 7A, the next step in the operation is to secure a plurality of bars such as the bars 24 to the underside of array 20. The bars 24 may be formed, for example, of an etchable material such as aluminum or may be formed of a foam or other air-filled material. Referring to FIG. 7B, once bars 24 are in position, a backing layer 25 is bonded to the underside of block 20 by for example being poured over the body and cured. Backing layer 25 may be on the order of 3 mm (0.120") thick, and would be formed from a material either substantially equivalent in acoustic impedance to the piezoelectric material being used or significantly different in acoustic impedance from the piezoelectric material. Usually, but not necessarily, this backing layer would be highly absorptive for sound waves at or near the piezoelectric frequency. The backing layer is thus operative to damp resonation and to isolate the wafers. Materials suitable for use as backing layer are known in the art. It is desired that any output signal from the piezoelectric crystal elements 16 which comes out of the back of the crystal be absorbed by backing layer 25 so as not to result in an echo signal which would distort the transducer output. It is also desired that the backing not result in crosstalk between the crystals through the backing layer. For the first embodiment of the invention, the bars 24 are used in achieving the decoupling objective in that these bars are either initially formed of an air-filled substance or, as will be discussed shortly, these bars are ultimately etched away, leaving gaps between the backing layer and the transducer array which may be filled with either air, an air-filled substance, or other suitable material. These air-filled bars or gaps significantly reduce the acoustic coupling between elements 16 and, to the extent any coupling exists, between the array 20 and backing layer 25. Other methods of achieving this objective will be discussed shortly.

Either at this point or at some earlier point in the operation, a mylar foil may be bonded to the top of the matching layer 14, or to the top of block 10 if a matching layer 14 is not used. The mylar foil layer, for example layer 33, shown in FIG. 9A, serves two functions. First, for embodiments where there are actual air spaces between crystals 16, the mylar foil serves to prevent water or other contaminants from getting into the gaps, such contaminants reducing the acoustic isolation of the gaps. Where the acoustic matching layer 14 is formed of a conductive material, this layer may also serve as a common connector, for example the ground conductor, to each of the crystal elements. Variations on this configuration will be discussed hereinafter.

Figure 8:
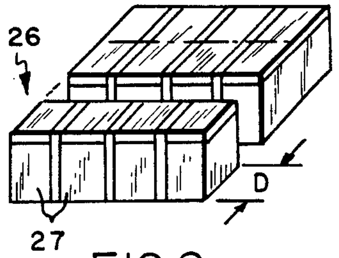
FIG. 8 is a top perspective view of a block array being cut to form individual transducer arrays.

The next step in the operation is to cut the block array 20 into a plurality of transducer arrays 26, each of a desired depth D (FIG. 8). For example, three or four transducer arrays may be cut from a single block, each array having a depth in the range of 0.5 cm to 1.5 cm.

While it is possible to perform the etching step at a point in the operation prior to cutting array 20 into transducer arrays 26, since layers 18 and bars 24 also provide structural support for the array, it is preferable that the etching step be delayed so that there is extra structural support for the piezoelectric wafers 16 during the step of cutting array 25 into transducer arrays and the steps prior thereto. The etching step may be performed by dipping the transducer arrays into an acid or base bath or by other suitable means to remove the affixed material 18 (and the bars 24 if these bars are formed of an etchable material). This leaves each transducer array 26 with a plurality of transducer elements 27, each of a precise width W spaced from each other by a distance T which results in a center-to-center element spacing equal to $\lambda_o/2$, the elements 27 being supported, and the spacing between them being maintained by backing layer 25. The transducer array thus formed has both optimum widths for the piezoelectric elements and optimum spacing between the elements with a high degree of precision even for high frequency applications.

Figure 9A:
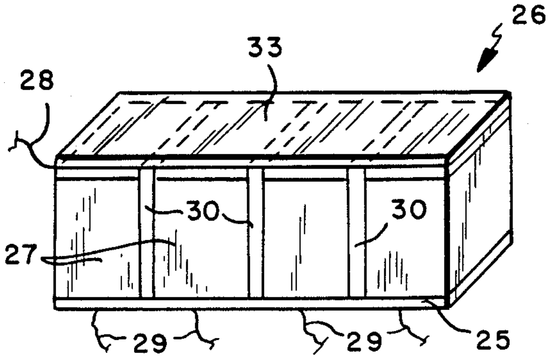
FIG. 9A is a top perspective view of a single transducer array for a first embodiment of the invention.

The remaining step in the operation is to connect a common lead 28 to the top of the transducer array and individual leads 29 to the bottom surface of each element (FIG. 9A). As previously indicated, if the matching layer 14 is conductive, a gold plated mylar foil or other conductive foil may be bonded to the top of array 26 and the overhang of this foil layer may be utilized as a common conductor 28. Since this foil layer would be on the order of 50 to 100 microns, it will not adversely affect the acoustic matching characteristics of matching layer 14. Other standard methods of connecting such a lead to an array may also be utilized.

Connection of the leads 29 to the underside of the individual piezoelectric elements may be done utilizing standard techniques presently employed in the industry for fixing such leads to the transducer array. For example, such leads could be soldered or otherwise attached to the underside of each element 16 or appropriately spaced on block 10 before backing layer 25 is poured and cured, and may project through this layer. In the alternative, various printed circuit techniques may be used for making connection to the underside of the wafers 16 or transducer elements 27, either before or after the backing layer 25 is poured. FIG. 9A illustrates the final transducer array obtained utilizing this embodiment of the invention with the air-gap 30 between adjacent piezoelectric transducer elements 16.

FIG. 4B illustrates the affixing step for an alternative embodiment of the invention. From this figure, it is seen that instead of affixing a solid layer of material 18, a layer of material 30 is affixed to crystal wafer 16 in a predetermined pattern, which pattern has substantially more area without material than with material. As in the embodiment shown in FIG. 4A, the material is of a thickness T which is equal to the desired spacing between piezoelectric wafers 16. While for purposes of illustration, the pattern of material 30 in FIG. 4B is in the form of two parallel, broken horizontal bars, the pattern could be in some other form provided that the pattern:

a. has substantially more area without material than with material so that the average acoustic impedance of the combined material and air in the space between each two adjacent wafers 16 differs from the acoustic impedance of the piezoelectric material by a sufficient amount so that the desired reflection coefficient is achieved;
b. has sufficient surface area to permit bonding to an adjacent wafer; and
c. covers sufficient area to provide controlled accurate separation between piezoelectric elements 27 after the block array has been cut into transducer arrays 26 (FIG. 8).

For this embodiment of the invention, the individual wafers are assembled into a block array as shown in FIG. 5B with an affixed pattern of layer 30 between each two adjacent piezoelectric wafers 16. An adhesive, such as crystal cement, may be used to secure the pattern segments 30 to the adjacent piezoelectric wafer 16. The thickness of the adhesive, being on the order of one micron or less, is sufficiently small compared to the thickness T of the layer 30 so as not to influence the final spacing. If necessary, the thickness of the affixed layer can be made slightly less than the desired thickness T so that the combined thickness of this layer plus the adhesive is equal to T. As with the previous embodiment of the invention, a fixture, such as fixture 22, may be utilized to properly position and hold the crystal wafers during assembly into a block array.

Figure 9B:
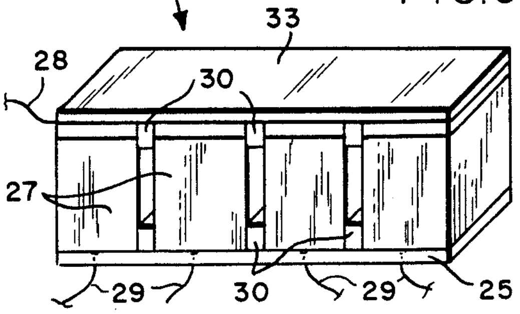
FIG. 9B is a top perspective view of a single transducer array for a second embodiment of the invention.

Since the nature of the pattern of layer 30 is such that most of the space between wafers is filled with air, for this embodiment of the invention it is not necessary to etch the layer 30. The block array 32 may have a foil layer bonded to it, have a backing layer 25 poured and cured, and be cut into individual transducer arrays in the same manner described for the first embodiment of the invention, and leads may be attached to the transducer arrays of this embodiment of the invention in the same manner previously described. In the alternative, the layer 30 may provide sufficient structural support so that the backing layer 25 is not required and the array is essentially air-backed, providing maximum acoustic isolation to avoid unwanted echoes and crosstalk. FIG. 9B illustrates the final array for this embodiment of the invention with the patterned layer 30 between each two elements 16.

This second embodiment of the invention thus provides a transducer array which has a slightly higher acoustic coupling between piezoelectric crystal elements in the transducer array than the embodiment of FIG. 9A, but which still has an acoustic coupling which is quite low, and generally more than adequate for the intended uses of the device. This embodiment has the advantage that it is much simpler and less expensive to fabricate, involving at least one fewer step than the prior process.

FIG. 4C illustrates a third embodiment of the invention wherein a strip of material 34 having a thickness T as previously defined is provided and is positioned between each two adjacent piezoelectric wafers 16 when the wafers and strips are assembled into a block array such as the block array 36 of FIG. 5C. Each strip 34 is formed of a material, such as expanded Teflon, which:

a. has sufficient rigidity to maintain the desired spacing between wafers in the block array;
b. encapsulates or entraps air so as to be constituted primarily of air or is of some other substance such that the acoustic mismatch between the strip 34 and wafer 16 is sufficient to provide the desired reflection coefficient; and
c. preferably has a high absorption coefficient (as would an air-filled material).

In addition to expanded Teflon, various foam materials such as closed cell foams might also be used in the space between wafers 16. The piezoelectric wafers and the strips 34 are bonded together using a crystal cement or other suitable adhesive to provide a block array with the desired wafer thickness and wafer spacing with the space between wafers being filled with a material of the type indicated above. Again, since the strips 34 are not etched away or otherwise removed, backing layer 25 may not be required to support the array. Further, since there is no etching, lower bars 24 may not be used, air spacing for backing layer 25 being obtained, if necessary, in another way. For example, in this embodiment in which backing layer 25 is desired for acoustic purposes but not required for mechanical support, bars 24 may be made of the same material as strips 34, affixed to the bottom of the block 20 by crystal cement or other suitable means, after which backing layer 25 is poured over the bottom of block 20 and cured.

For an embodiment of the invention where the space between wafers is filled with a closed cell foam, the piezoelectric elements 16 may be mounted in a suitable fixture such as slotted fixture 22 (FIG. 6) with the desired spacing between elements, and the closed cell foam is then injected into the fixture to fill the space between wafers. If additional rigidity for the structure is desired, space may also be provided in the fixture either under the wafers, or the wafers may be mounted, matching layer side down, with additional space provided at the top of the fixture into which the closed cell foam material is injected to form a backing layer 25.

Figure 9C:
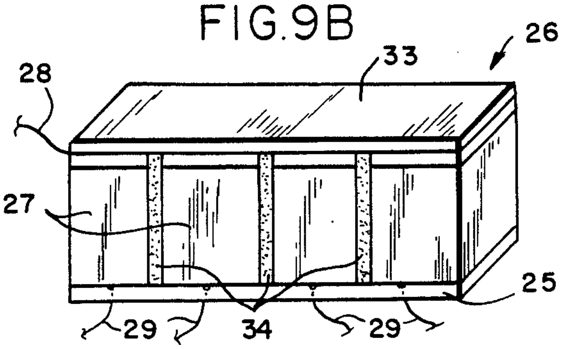
FIG. 9C is a top perspective view of a single transducer array for a third embodiment of the invention.

Otherwise, the operations performed for this embodiment of the invention, once the block array 20 has been formed, may be identical to those previously described with respect to prior embodiments of the invention. FIG. 9C illustrates the final array for this embodiment of the invention with material such as a strip 34 of closed cell foam between adjacent elements 27.

In the discussion above, three different methods of forming transducer arrays have been described which result in three slightly different transducer arrays. Certain variations on each of the methods have also been discussed. Each of the resulting arrays has the characteristic that the piezoelectric element thickness is equal to $\lambda_p/2$ (or other desired value) with a high level of precision, the space between the centers of the piezoelectric elements is equal to $\lambda_o/2$ with a high level of precision, the space between elements is filled at least primarily with air or with another substance having the required acoustic impedance mismatch characteristics, resulting in a low acoustic coupling between piezoelectric elements, and each of the arrays is relatively simple and inexpensive to fabricate. It is apparent that some variations are possible in the sequence in which various steps in the operations described above are performed, and that certain variations in the dimensions and materials utilized are also possible. Thus, while the invention has been particularly shown and described above with reference to preferred embodiments, the foregoing and other changes of form and detail may be made therein by one skilled in the art without departing from the spirit and scope of the invention.

What is claimed is:

1. A method of fabricating an ultrasonic transducer array adapter for scanning a selected object having a predetermined object wavelength comprising the steps of:

cutting a block of piezoelectric material having a top surface in a directions perpendicular to said top surface to form a plurality of wafers, each of said wafers being of a predetermined thickness;

affixing an etchable material of predetermined depth to one side of each wafer surface except for the wafer which is to be the end wafer on the one side of the array;

forming the wafers into a spaced parallel array with each adjacent pair of wafers in the array being spaced by a layer of affixed material, the predetermined thickness for etchable material being such that the center-to-center spacing between adjacent wafers in the array is substantially equal to one-half the object wavelength; and etching away the affixed material to leave a spaced transducer array with a substantially one-half object wavelength center-to-center spacing.

2. A method as claimed in claim 1 wherein said forming step includes mounting a means to the wafers to maintain their spacing after the affixed material has been etched away.

3. A method as claimed in claim 2 wherein said means mounted to the wafers is a backing layer.

4. A method as claimed in claim 1 including the step performed at a time after the forming step of cutting the spaced array apart in the elevation direction to form a plurality of transducer arrays.

5. A method as claimed in claim 4 including the step of connecting leads to each transducer array.

6. A method as claimed in claim 1 including the step of bonding a backing layer to the underside of the spaced wafer array.

7. A method as claimed in claim 6 including the steps of providing gaps between the backing layer and the array, and filling the gaps with a material which reduces the acoustic coupling between the elements and between the elements and the backing.

8. A method as claimed in claim 7 wherein said providing gaps step includes the step performed before the bonding the backing layer step of affixing etchable material to the underside of the array in a predetermined pattern, and the step performed after the bonding step of etching away said material.

9. A method as claimed in claim 7 wherein said filling the gaps step includes the step of filling the gaps with a substance which is composed at least primarily of air.

10. A method as claimed in claim 1 including the step of bonding a matching layer to the top surface of the block of piezoelectric material before it is cut into wafers.

* * * * *